United States Patent [19]
Huggins et al.

[11] Patent Number: 5,947,484
[45] Date of Patent: Sep. 7, 1999

[54] QUICK-CHANGE CHUCK DEVICE

[75] Inventors: Mark S. Huggins, Clemson; Kenneth M. Montjoy, Seneca, both of S.C.

[73] Assignee: Power Tool Holders Incorporated, Wilmington, Del.

[21] Appl. No.: 09/067,569

[22] Filed: Apr. 28, 1998

Related U.S. Application Data

[63] Continuation-in-part of application No. 08/922,411, Sep. 3, 1997.

[51] Int. Cl.⁶ .................................................. B23B 5/22
[52] U.S. Cl. ........................... 279/43.4; 279/30; 279/49; 279/75; 279/905
[58] Field of Search ............................... 279/30, 42, 43, 279/43.1, 43.4, 43.5, 44, 45, 47, 49, 50, 74, 75, 157, 903–905

[56] References Cited

U.S. PATENT DOCUMENTS

| | | |
|---|---|---|
| Re. 31,755 | 12/1984 | Wanner et al. . |
| 1,227,632 | 5/1917 | Lagerback . |
| 1,265,707 | 5/1918 | Berglund . |
| 1,353,299 | 9/1920 | Wilson . |
| 1,636,421 | 7/1927 | Knott . |
| 2,727,748 | 12/1955 | Benjamin et al. . |
| 2,807,473 | 9/1957 | Kiehne . |
| 2,843,388 | 7/1958 | Butler . |
| 2,860,883 | 11/1958 | Better et al. . |
| 2,926,020 | 2/1960 | Dayton et al. . |
| 3,070,380 | 12/1962 | Holmberg . |
| 3,521,895 | 7/1970 | Smith . |
| 3,727,928 | 4/1973 | Benjamin . |
| 3,816,015 | 6/1974 | Bilz et al. . |
| 4,395,051 | 7/1983 | Tonomura . |
| 4,513,980 | 4/1985 | Kruse . |
| 4,525,111 | 6/1985 | Gutsche . |
| 4,570,952 | 2/1986 | Heimbigner et al. . |
| 4,599,019 | 7/1986 | Ueberall . |
| 4,692,073 | 9/1987 | Martindell . |
| 4,721,423 | 1/1988 | Kubo . |
| 4,799,838 | 1/1989 | Kubo et al. . |
| 4,808,049 | 2/1989 | Cook . |
| 4,867,463 | 9/1989 | Hopf . |
| 4,902,177 | 2/1990 | Burnett . |

(List continued on next page.)

FOREIGN PATENT DOCUMENTS

| | | |
|---|---|---|
| 3508513 A1 | 9/1986 | Germany . |
| 31516 | 3/1980 | Japan . |
| 587871 | 5/1947 | United Kingdom . |

OTHER PUBLICATIONS

European Patent Office Search Report, Jan. 5, 1999.
U.S. application No. 08/909,343.
U.S. application No. 08/808,890.

*Primary Examiner*—Daniel W. Howell
*Assistant Examiner*—Monica Smith
*Attorney, Agent, or Firm*—Dority & Manning

[57] ABSTRACT

A quick release chuck device has a body member defining an axially extending bore for receipt of a tool shank. At least a portion of the bore is defined by a plurality of radially compressible and axially extending gripping segments. The gripping segments are equally spaced and defined by axial slots extending from a front face of the body member. At least two axially extending and aligned recesses are defined on each of the gripping segments. An operating member is coaxial with and surrounds at least the gripping segments of the body member. The operating member defines a varying radial width channel with the recesses formed on the outside of the gripping segments. The operating member is axially movable relative to the body member. Actuating elements, such as balls, are disposed within the varying radial width channels. The actuating elements are movable within the channels by axial movement of the sleeve member from a gripping position wherein the balls are in a reduced radial width section of the channels causing the gripping segments to compress radially inward, and a release position wherein the balls move into a greater radial width section of the channels allowing radial expansion of the gripping segments.

34 Claims, 9 Drawing Sheets

U.S. PATENT DOCUMENTS

| | | |
|---|---|---|
| 4,989,887 | 2/1991 | Jordan . |
| 5,096,212 | 3/1992 | Walsh . |
| 5,193,824 | 3/1993 | Salpaka . |
| 5,253,879 | 10/1993 | Huff et al. ............................ 279/157 |
| 5,301,961 | 4/1994 | Wozar . |
| 5,409,243 | 4/1995 | Shadeck et al. ..................... 279/157 |
| 5,464,229 | 11/1995 | Salpaka . |
| 5,810,366 | 9/1998 | Montjoy et al. . |

QUICK-CHANGE CHUCK DEVICE

The present application is a Continuation-in-Part Application of U.S. application Ser. No. 08/922,411, filed on Sep. 3, 1997.

BACKGROUND OF THE INVENTION

The present invention relates to a tool holding device configured for attachment to a drive spindle of a machine or power tool and used for holding tool bits that are worked by the machine or power tool, and more particularly to a quick-change chuck device that permits change-out of tool bits without the necessity of applying an external tool or wrench to the chuck.

Any collet or chuck device utilized for holding a tool bit to a drive spindle of a machine tool, such as a router, must lock the bit both axially and radially with respect to the drive spindle. In other words, the chuck must prevent the tool bit from rotating relative to the drive spindle and from moving axially toward or away from the drive spindle. This concern is particularly important with high speed machine tools, such as routers, laminate trimmers, dry wall cutters, etc., both for accuracy and safety considerations.

With conventional systems, one relatively simple means for rotationally securing the tool bit consists of defining a hexagonal or other multi-sided profile on the end of the tool bit which fits into a corresponding multi-sided recess formed in the chuck device. With this conventional mechanism, the operator typically needs to use at least one wrench and a spindle lock, or two wrenches, in order to change the tool bit.

With another known device, collet chucks utilize a compressible collet for axially and rotationally holding the tool bit. Collet chucks are useful in that they do not depend on a multi-sided configuration in the tool bit for holding the tool. Thus, any manner of power bits or tool bits having essentially round shank portions may be held by a collet chuck device. However, collet chuck devices do not have the quick-change or quick release capabilities that are desired in many applications.

It is highly desirable for portable tools, such as routers or laminate trimmers, to utilize a quick release chuck device for relatively quick and easy change out of tool bits. However, with the conventional quick release devices, the tool shank portions must be multi-sided to fit within corresponding bores defined in the quick-change chuck devices. It would be desirable in the art to have a quick-change chuck device which can be utilized with any manner of tool bit, including tools bits that have essentially round tool shanks, for increasing the versatility and ease of operation of machine tools utilizing such chuck devices.

Also, with many types of conventional chucks, it is necessary to hold the tool bit at a desired height relative to the chuck while tightening or otherwise actuating the chuck until the tool bit is securely held by the chuck. If the tool bit is not held during the tightening operation, it will fall out of the chuck or into the chuck up to the working surface of the too bit, depending on the orientation of the power tool. This can be a difficult exercise, particularly when space in the area of the chuck and tool bit is relatively limited, for example as with routers wherein the space in the area of the router guide and chuck is very limited. It is particularly awkward in this situation when the operator must use both hands to change out the tool bit. One hand must hold the tool bit to ensure that it remains at a proper height, while the other hand is used to actuate the chuck. It may also be necessary for the operator to physically grasp the tool bit on relatively sharp cutting edges thereof, which is an obvious undesired situation.

An additional problem with many conventional types of chucks is that dirt, debris, etc., tends to migrate into the body of the chuck and eventually degrades performance of the chuck or causes the chuck to fail. This is particularly true in many routing applications wherein the chuck operates in very close proximity to the router bit.

The present invention also relates to a chuck device incorporating a feature to retain a tool bit or shank inserted into the chuck at a specific height regardless of the actuating position of the chuck. The tool bit retaining feature may also act as a seal for the chuck to keep dirt, debris, etc., from entering into the body of the chuck.

OBJECTS AND SUMMARY OF THE INVENTION

Therefore, a principal object of the present invention is to provide a quick-change chuck device for securing a tool bit or working device to a drive spindle of a machine or power tool.

Another object of the present invention is to provide a versatile quick-change chuck device which is capable of holding tool bits having multi-sided or round tool shanks.

A further object of the present invention is to provide a fast acting-quick-change chuck device in which a tool bit can be readily inserted and removed without having to align a multi-sided profile of the tool with a multi-sided bore in the chuck device.

And yet another object of the present invention is to provide a quick-change chuck device that overcomes lock-up of tool bits inside the chuck device.

Still an additional principal object of the invention is to provide an improved chuck device incorporating a feature to retain a tool bit at a desired height regardless of the actuating position of the chuck.

Another object of the invention is to provide a sealing device for chucks to inhibit the migration of dirt, debris, etc., into the chuck body.

Additional objects and advantages of the invention will be set forth in part in the description which follows, and in part will be obvious from the description, or may be learned through practice of the invention. The objects and advantages in the invention may be realized and attained by means of the instrumentalities and combinations particularly pointed out in the appended claims.

In accordance with the objects and purposes of the invention, as embodied and broadly described herein, a chuck device according to the invention for receipt of an axially extending tool shank includes a body member defining a central longitudinal axis and an axially extending bore defined therein for receipt of the tool shank. At least a portion of the bore is defined by a plurality of radially compressible and axially extending gripping segments that may include reliefs defined therein. The gripping segments are separated by equally spaced axial slots extending from a front face of the body towards a back end thereof. Each of the segments also includes at least two axially extending and axially aligned recesses defined on the outer circumference thereof. An operating member is provided coaxial with and surrounding at least the gripping segments of the body member. The operating member cooperates with the recesses and defines axially extending and axially aligned channels. The channels have a varying radial width along the axial length thereof. The operating member is also axially movable relative to the body member. Actuating elements, preferably rolling balls, are disposed within the channels. The actuating elements are axially movable within the channels through axial movement of the operating member from a gripping position wherein the elements are in a reduced radial width section of the channels. In this position, the actuating elements or balls cause the gripping segments to compress radially inward to grip upon a tool shank inserted in the bore. The actuating elements or balls are movable to a release position wherein the actuating elements move into a greater radial width section of the channels. In this position, the actuating elements do not compress the gripping segments and the segments are allowed to expand radially and release upon a tool shank held in the bore.

In a preferred embodiment, the recesses comprise ramped surfaces that are sloped in the longitudinal direction towards the longitudinal axis of the body. The ramp surfaces thus define the varying radial width of the channels. In an alternative embodiment, the ramped surfaces may be defined on the operating member. For example, the operating member may include a sleeve member that has an axially ramped inner circumferential surface disposed radially opposite from flat recesses. This ramped surface thus defines the varying radial width for the channels.

The channels on each of the segments are preferably separated by an annular flange extending radially from the body. Preferably, two such axially aligned recesses are formed on each gripping segment. The recesses are aligned with adjacent recesses on adjacent segments so that essentially two bands of recesses are defined on the outer circumferential surface of the body.

Because of the fact that at least two axially aligned channels are defined for each of the gripping segments, a radial compressive force is applied to the gripping segments at at least two well defined points along the length of the gripping segments corresponding essentially to the area of reduced radial width of each channel. Applicants have determined that a greater gripping strength and slip torque can be obtained by applying the compressive force at well defined points along the length of the gripping segments that are further defined by reliefs formed on the inner circumferential face of the gripping segments.

Although the present invention is described herein as including only two axially aligned recesses, it should be understood that a greater number of recesses and corresponding actuating elements is within the scope and spirit of the invention.

The present invention also contemplates applying different degrees of compressive force for each of the axially aligned channels. For example, the varying radial widths for the axially aligned channels need not necessarily be the same. In one preferred embodiment, the channel disposed closest to the front face of the body member has a reduced width section that is less than the reduced radial width section for the second channel disposed axially rearward of the first channel. Thus, in this embodiment, so long as the actuating elements are the same size, a greater compressive force will be applied at the position of reduced radial width in the first channel.

In an alternative embodiment, the axially aligned channels may comprise uniform varying widths and the actuating elements in each of the channels may be of different size. For example, to provide a greater compressive force in the first channel closer to the front face of the body, the actuating elements may comprise rolling bodies having a diameter greater than the rolling bodies disposed in the axially rearward channel.

The actuating elements are moved within the channels by way of frictional engagement with the operating member. In this regard, the operating member may comprise a sleeve member wherein the actuating elements or rolling bodies are in frictional rolling engagement with the inner circumferential surface of the sleeve member. The sleeve member may also include a hardened insert which defines the engaging circumferential surface.

The chuck device also preferably incorporates a locking mechanism to positively lock the operating or sleeve member in its axial position. This locking mechanism can comprise any number of devices, including a friction lock between the operating member and the actuating elements. The locking mechanism may also include a ball and detent device, or other suitable positive locking mechanism.

Applicants have also determined that the gripping strength of a chuck device according to the invention is significantly increased if the bore defined in the body member is tapered from a larger diameter at the front face of the body member to a smaller diameter at the back end of the bore. For example, in a chuck having a 0.500 inch capacity, applicants have found that a taper in the range of 0.002 to 0.004 inches from the forward face of the body to the back end of the bore significantly enhances gripping strength or slip torque. In this tapered bore embodiment, it may be preferred to apply an increased compressive radial force in the forward most axial channel.

In an alternative preferred embodiment of the invention, the sleeve member may include a front cap section having a bore generally aligned with the body member bore. The cap section includes a tool bit retaining member disposed within the bore of the cap to engage and retain the tool shank at a desired height regardless of movement of the sleeve member between the gripping and release positions. The tool bit retaining member may comprise a resilient ring member having an inner diameter less than that of the tool shank inserted into the chuck device. The cap section may include a circumferential groove generally defining the bore through the cap section with the ring member disposed within the circumferential bore.

The cap section may be removable from the sleeve member to provide access for servicing the chuck device. In this embodiment, the cap section may be snap-fitted or otherwise attached to the sleeve member by any conventional attaching means.

In addition to acting as a retaining member for the tool bit, the resilient ring member also forms a seal around the tool shank. In this regard, the resilient member and cap section together form an effective seal over the front end of the chuck to prevent debris from entering into the chuck body.

Preferably, the tool shank retaining member also acts to center the tool shank within the body of the chuck and maintain the tool shank axially aligned within the body member as the sleeve member is moved between the release and gripping positions.

It should be appreciated that the inventive sleeve member according to the invention incorporating a cap section and tool shank retaining member can be utilized with any manner of chuck incorporating an actuable sleeve member. This feature of the invention is not limited to any particular operating mechanism of the chuck.

DETAILED DESCRIPTION OF THE PREFERRED EMBODIMENTS

Reference will now be made in detail to the presently preferred embodiments of the invention, one or more examples of which are illustrated in the accompanying drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and the description.

Figure 1A:
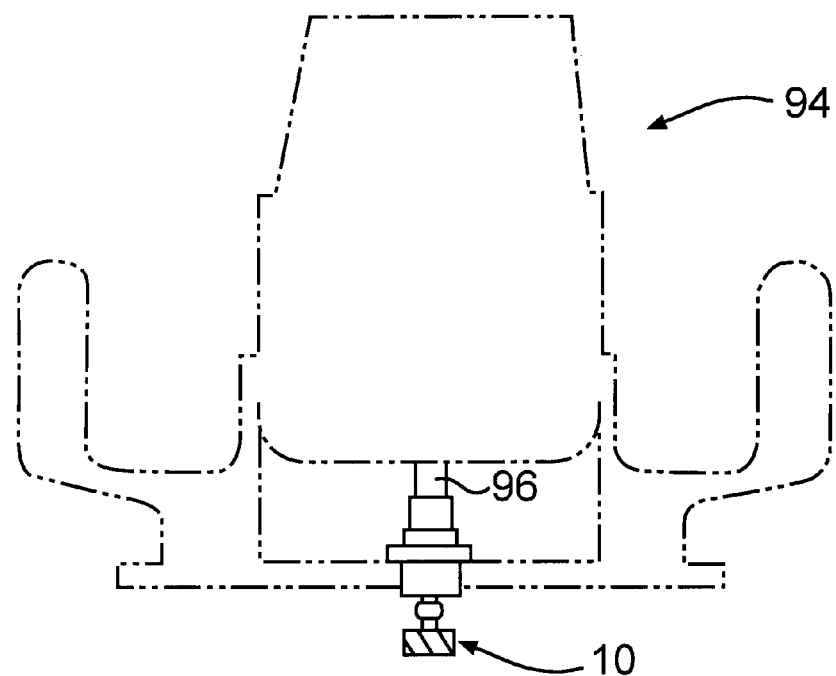
FIGS. 1a and 1b are a conceptional view of the chuck device according to the invention attached to a drive spindle of a power tool illustrated in dashed lines.
Figure 1B:
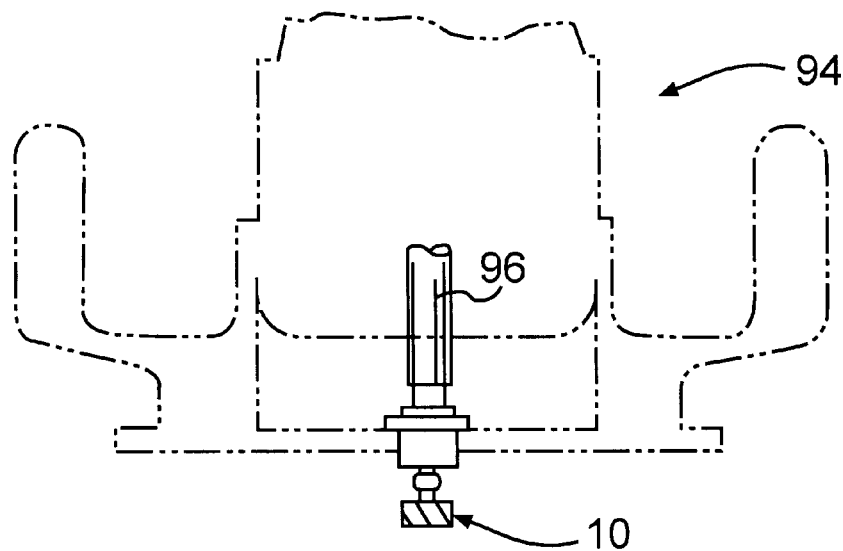

The present invention relates to a tool holding device or chuck, generally illustrated as reference 10 in the figures. The chuck preferably includes a conventional mechanism or device for mounting chuck 10 to a drive spindle 96 of a power tool, such as the router 94 illustrated in FIGS. 1a and 1b. It should be understood that FIGS. 1a and 1b are for illustrative purposes only and do not limit application of the present invention. Chuck device 10 according to the invention is useful in any application or environment wherein it is desired to hold a tool shank to a power tool. The invention is particularly useful in high-speed applications, such as in routers, laminate trimmers, dry wall cutters, etc. Any and all such applications and uses of the present chuck 10 are within the scope and spirit of the invention.

The figures illustrate chuck device 10 as having a threaded male extension 92 which would be received by a female threaded section defined on the spindle of the power tool. It should be understood, however, that the particular mechanism for mounting the chuck to a machine or power tool is not of critical importance to the invention. For example, the male threaded section may be defined on the drive spindle with a female threaded section defined on chuck device 10. Alternatively, the chuck device may be configured as an insert device which is insertable into a receiving socket of a drive spindle. In another embodiment, the chuck device may held by a conventional set screw, or threaded retaining screw. Alternatively, a tapered mount and screw assembly may be used, as commonly understood by those skilled in the art. And in still a further embodiment, chuck device 10 may be formed as an integral component of the drive spindle. The chuck device may also be mounted in accordance with U.S. Pat. No. 5,193,824 commonly owned by the present assignee. It should be appreciated that any conventional mounting mechanism or means is applicable to the present inventive chuck device.

Referring to the figures in general, chuck device 10 comprises a body member 14 defining a central longitudinal axis and an axially extending bore 18 defined therein for receipt of a round tool shank. Body member 14 includes a plurality of axially extending gripping segments 20 separated by axial slots 22 extending from a front face 24 of body member 14 towards a back face or end 26. In the embodiment illustrated, four such segments 20 are illustrated. However, a greater or lesser number of segments can be utilized.

At least a portion of bore 18 is defined by the inner circumferential surface of segments 20. In operation, a tool shank is inserted through the front face 24 of body member 14 into bore 18. The tool shank is held within the bore by the application of a radially compressive force applied to gripping segments 20. The gripping segments 20 are radially compressible inward due to slots 22, as will be explained in more detail below. The present invention also contemplates holding multi-sided tool shanks, so long as the bore 18 is correspondingly shaped. In this embodiment, the gripping segments provide an axial holding force.

At least two axially extending and axially aligned recesses 28 are defined on the outer circumferential surface of each of segments 20. These recesses are separated by an annular flange 50. Recesses 28 are "axially aligned" in that one is directly behind the other in the longitudinal sense of chuck device 10. Although two such recesses are illustrated in the figures, it should be understood that a greater number may also be utilized. Recesses 28 are defined by a floor having an essentially flat section 29 and a ramped section 30 that is ramped in the longitudinal sense towards the longitudinal centerline of bore 18, as particularly illustrated in FIGS. 2, 3, and 7.

An operating member, for example a sleeve 44 as illustrated in the figures, is coaxial with and surrounds at least the gripping segments 20 of body member 14. The inner circumferential surface of sleeve 44 is radially opposite recesses 28 and cooperates with the flat and ramped surfaces 29, 30 to form axially extending channels 34. In other words, channels 34 are defined on their radially outward side by operating member or sleeve 44 and on the radially inward side by the flat and ramped surfaces 29, 30 of recesses 28. In this embodiment, sleeve 44 may contain an insert 48 that is of a hard metal or steel, particularly if sleeve 44 is formed of a plastic material. Insert 48 may be formed integral with sleeve 44 or press-fitted therein.

It should be understood that the axially extending channels 34 have a varying radial width from one longitudinal end of the channel to the other. A greater radial width section 42 (FIG. 7) is defined in the area of ramped surface 30. A lesser radial width section 40 is defined in the axially rearward section of the channel defined by flat surface 29.

A plurality of actuating elements are disposed within channels 34. In the embodiment illustrated, the actuating elements comprise rolling bodies or balls 38 held in a ball cage 90. Ball cage 90 includes a number of tabs 99 cut or formed therein that extend radially inward. Tabs 99 align with the axially extending slots 22 to ensure that ball cage 90 does not rotate relative to gripping segments 20 to prevent balls 38 from dropping into slots 22. As will be explained below, it is important that balls 38 reside within channels 34 between gripping segments 20 and sleeve 44. It should be understood that any conventional mechanism can be used to maintain ball cage 90 in place relative to the gripping segments 20, including pins, set-screws, etc.

Figure 2:
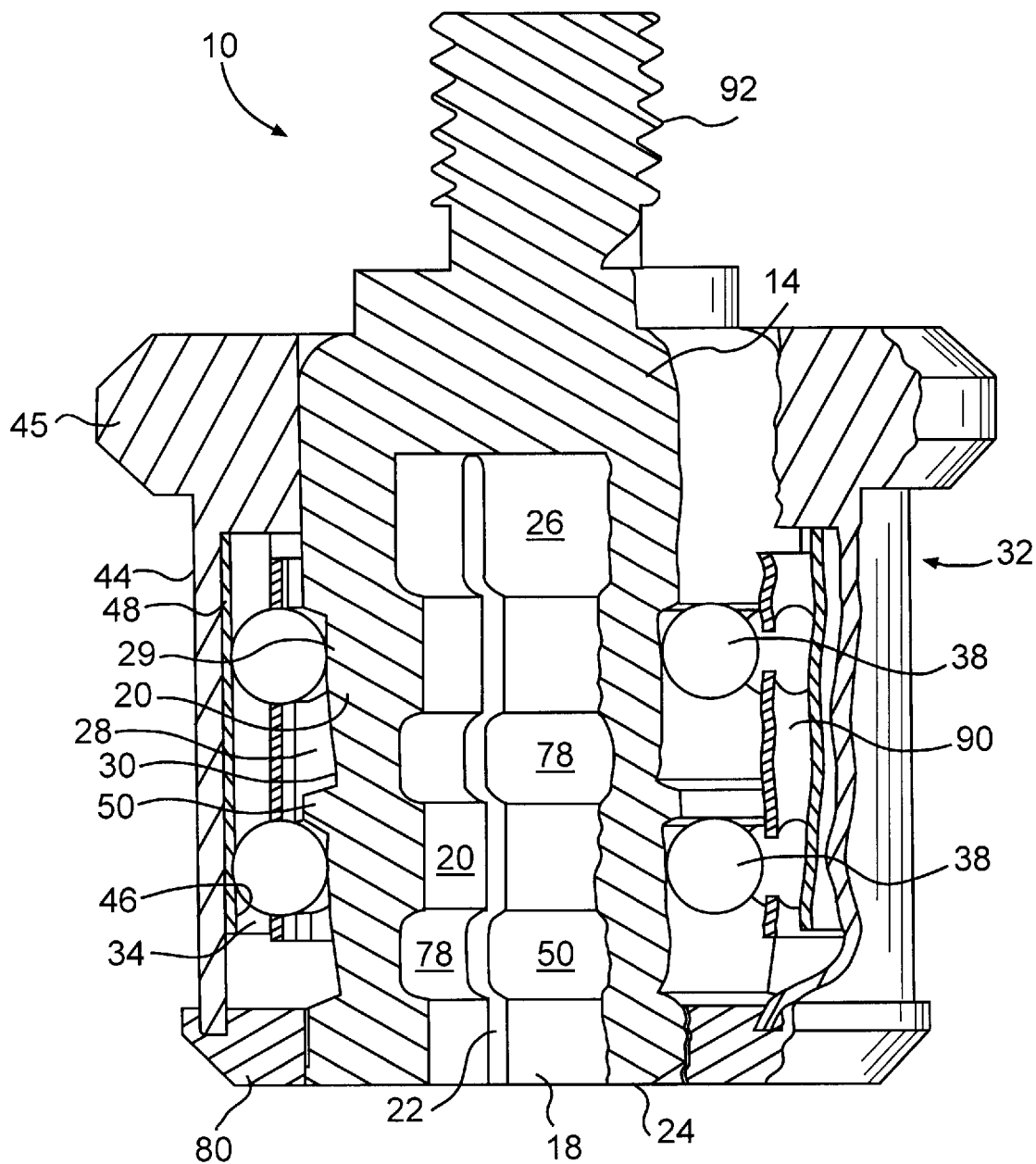
FIG. 2 is a cross-sectional view of the chuck device according to the invention.
Figure 3:
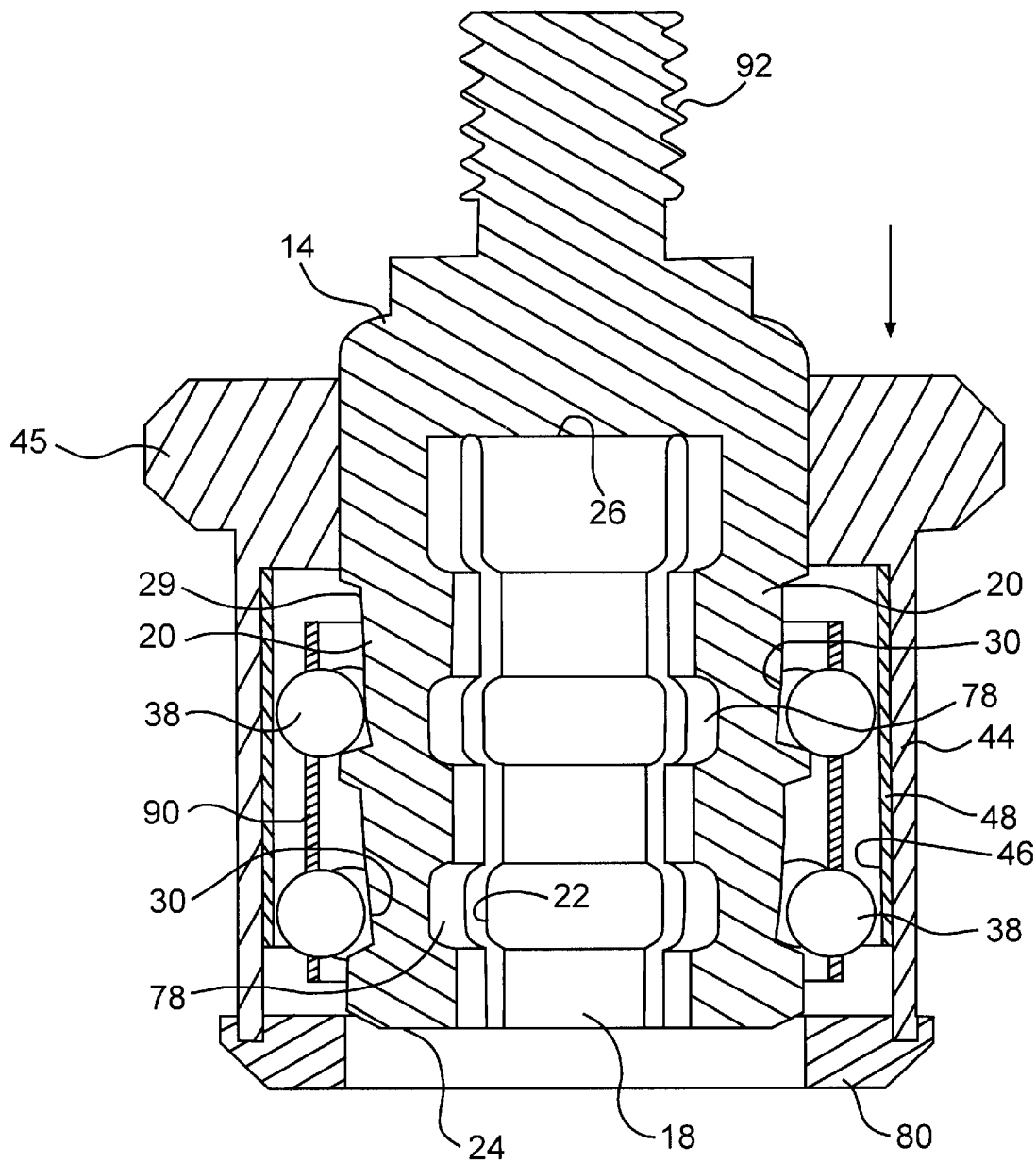
FIG 3 is a cross-sectional operational view of the chuck device illustrated in its unlocked or release position.

Rolling bodies or balls 38 act as actuating elements in that they are axially movable within channels 34 by axial movement of sleeve member 44 from a gripping position illustrated in FIG. 2 to a release position illustrated in FIG. 3. In the gripping position illustrated in FIG. 2, balls 38 reside within the lesser radial width section 40 of channels 34. Since the balls are essentially not compressible, they apply a compressive radial force to the flexible segments 20 causing segments 20 to compress radially inward and grip upon a tool shank held within bore 18. Applicants have found that a greater gripping strength or slip torque can be generated by applying the compressive radial force to gripping segments 20 in at least two distinct longitudinal locations. Thus, the axially aligned channels 34 are provided. Referring to FIGS. 2 and 3 in general, it can be seen that the compressive radial force is applied at the location where balls 38 reside in the axially rearward section of channels 34 where the channels have their smallest radial width.

Figure 7:
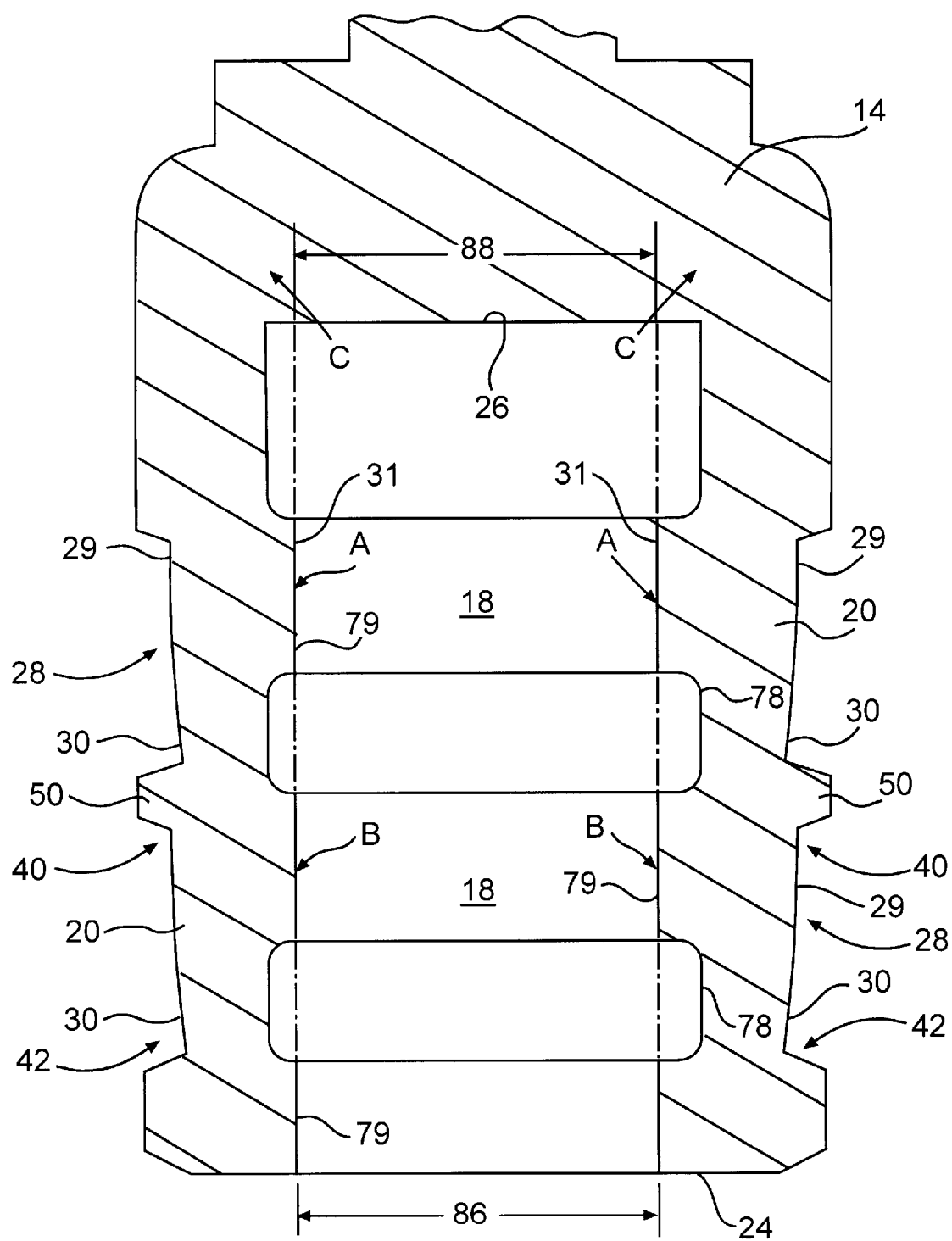
FIG. 7 is an enlarged cross-sectional view of the body member according to the chuck device particularly illustrating the tapered bore.
Figure 8:
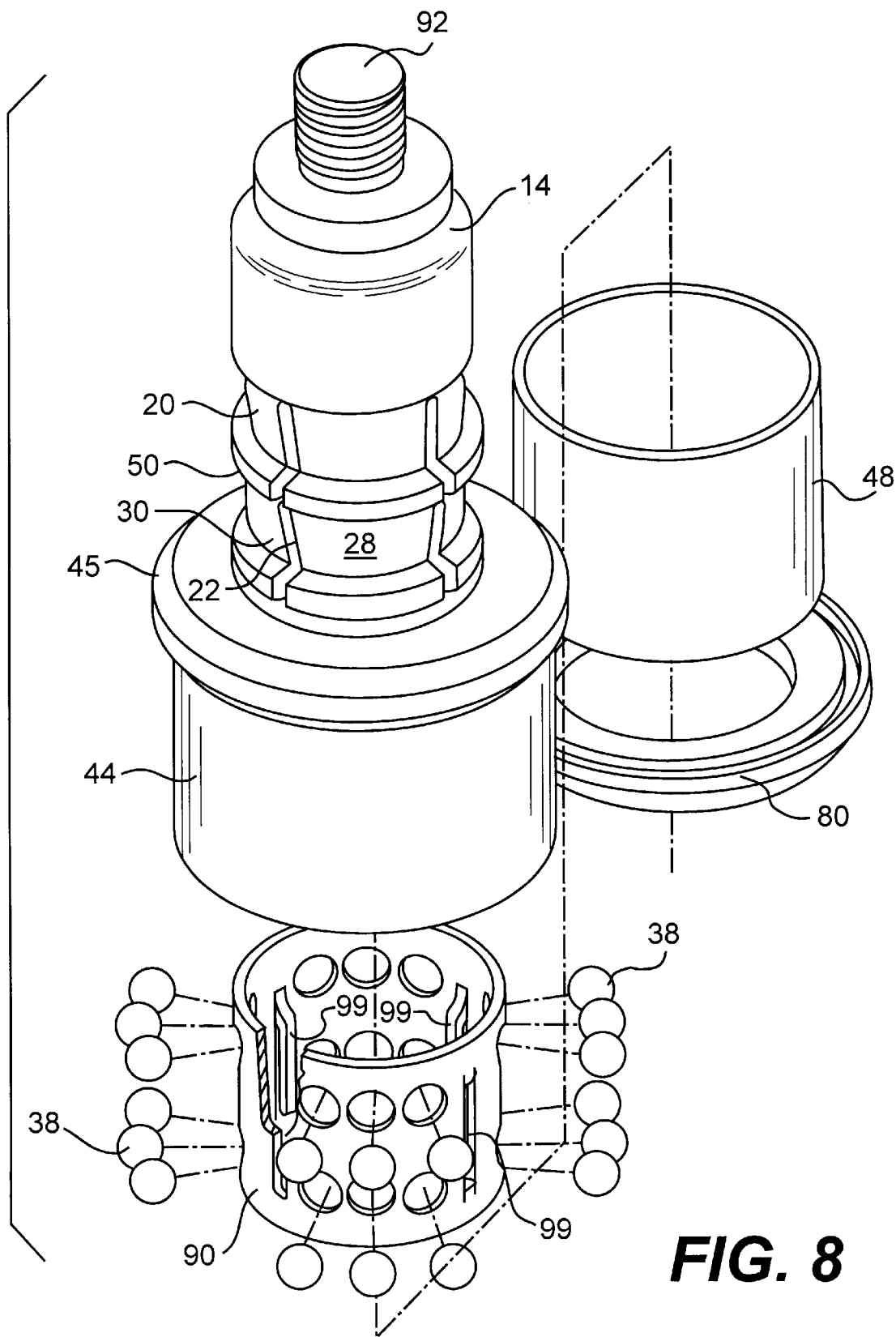
FIG. 8 is an in-line assembly view of the chuck device according to FIG. 2.

Referring particularly to FIG. 7, applicants have also determined that it is preferred to form reliefs 78 in bore 18. Reliefs 78 are formed by longitudinal recesses defined on the inner circumferential surface of gripping segments 20 which define bore 18. Applicants believe that reliefs 78 cause the radial compressive force to be concentrated along the flat segments 79 (FIG. 7) of bore 18, and that this concentration of the force along a more limited defined axial front and rear area increases stiffness of the system and reduces vibration of the tool bit within the gripping segments.

Referring again to FIG. 7, bore 18 is illustrated as a tapered bore having a front diameter 86 that is greater than rear diameter 88. For a chuck device having a capacity of 0.500 inches, the forward end diameter 86 of the bore is about 0.503 inches and tapers to about 0.500 inches at the rear diameter 88. A preferred taper is in the range of from about 0.002 to about 0.004 inches over the axial length of the bore. However, it should be understood, that any range of tapers is within the scope and spirit of the invention, and also that the degree of taper may vary depending on the chuck size or capacity. Not wishing to be held to any particular theory, applicants believe that the taper causes an amplification of the gripping or radially compressing force at the axially rearward position of the bore. For example, referring to FIG. 7, the point of radial compression applied by balls 38 is at the flat surface 29 of recesses 28. When the radial force is applied to segments 20 at these positions, segments 20 tend to pivot or flex generally at a point axially rearward of end face 26 where the segments are formed integral with body 14. However, bore 18 has its least diameter at location 31 that is axially rearward of the point of compressive force applied by the most axially rearward set of balls 38, as can be particularly seen in FIG. 7. At location 31, bore 18 has a diameter essentially equal to that of the tool shank so that an initial point of contact or near-contact is defined at point 31. Applicants believe that the taper generates a lever or a moment arm between each of the locations of applied radial force A, B, and the pivot or flex point C, and that this moment arm significantly magnifies the compressive force at the position of least diameter 31 of bore 18. In other words, two moment arms are created; one moment arm from the point of radial compression in each of the axial channels 34. Applicants have tested a 0.500 inch capacity chuck device illustrated in the figures with and without the tapered bore, and the embodiment with the tapered bore as illustrated in FIG. 7 has a significantly increased gripping strength or slip torque.

It should be appreciated by those skilled in the art that the degree of taper of bore 18 will depend on the size and capacity of the chuck 10.

Figure 6:
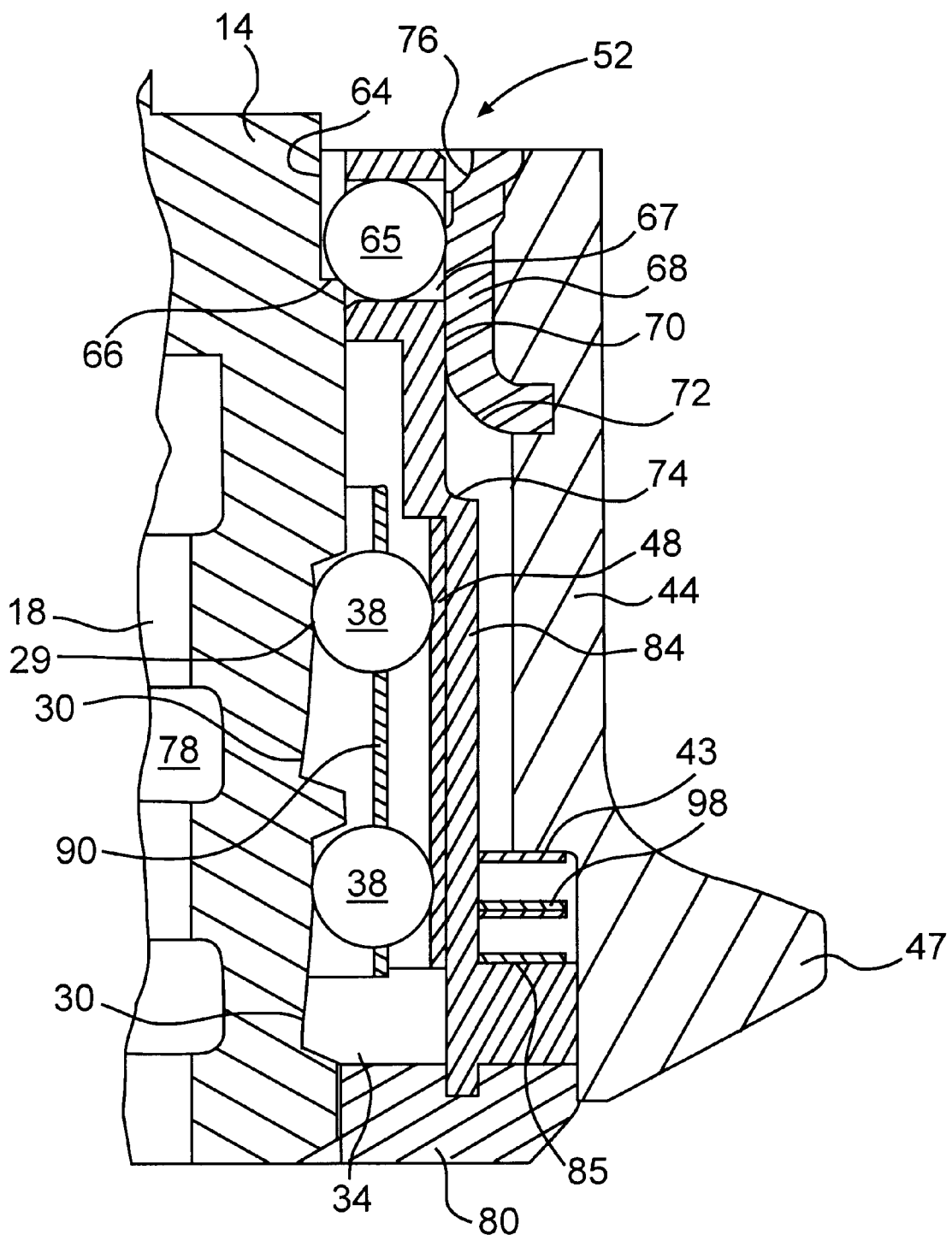
FIG. 6 is an enlarged cross-sectional view of an alternative embodiment of the chuck device.

FIG. 3 illustrates chuck 10 wherein actuating element or sleeve 44 has been moved axially forward into the release position. When sleeve 44 is moved axially forward, frictional engagement between sleeve 44, or insert 48, and balls 38 causes balls 38 to roll axially forward into the increased radial width section 42 of channels 34. In this position, balls 38 do not apply the compressive radial force to segments 20 and segments 20 are free to expand radially outward and thereby release upon any tool shank held within bore 18. In the embodiment illustrated in FIGS. 2 and 3, sleeve member 44 includes an annular flange 45 defined on the rear section of the sleeve. FIG. 6 illustrates an embodiment wherein the annular flange 47 is formed on a forward end of sleeve 44.

The figures also generally illustrate a device wherein the actuating member or sleeve 44 is moved axially forward to disengage the chuck. It should, however, be understood that chuck device 10 can be configured so that the actuating member or sleeve 44 is moved axially rearward to move rolling bodies 38 into their release position. In this embodiment, the ramped sections 30 would be formed on the axially rearward section of recesses 28.

Figure 5:
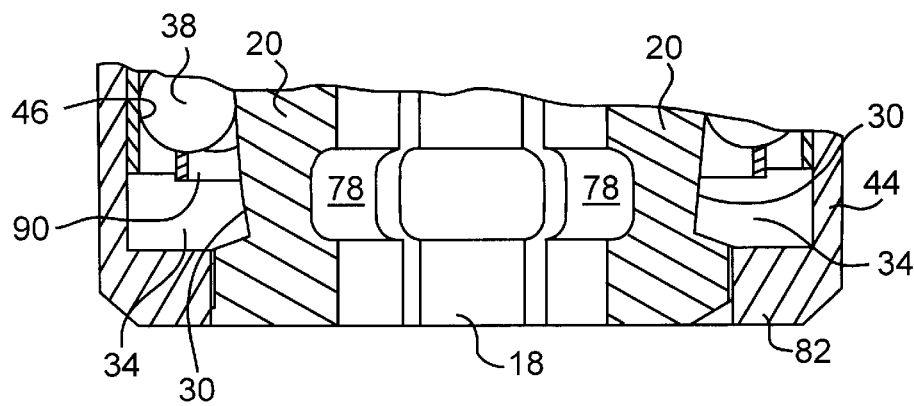
FIG. 5 is an enlarged cross-sectional view of an alternative embodiment of the front end of the chuck device.

FIGS. 2 and 3 illustrate chuck device 10 as having a capped member 80 that is separate from sleeve 44 and press-fitted onto a forward end of the sleeve. FIG. 5 illustrates a device wherein sleeve 44 includes a cap section or member 82 formed integral therewith. It should be appreciated that any configuration of the sleeve and cap member can be utilized in the present invention. For example, the cap may include fingers that extend into slots 22 to prevent dirt or dust from accumulating in the slots.

It is also within the scope of the present invention that the varying radial widths for the axially aligned channels 34 are different. In other words, it is possible for the section of reduced radial width 40 for the channel 34 closer to front face 24 to have a radial width that is less than that for the section of reduced radial width 40 in the axially rearward channel. It should be understood that, in this embodiment, a greater compressive force would be generated in the axially forward channel so long as the actuating elements or balls 38 have the same diameter in each of the channels. Thus, varying degrees of compressive force can be generated in each of the axially aligned channels. This embodiment may be particularly preferred wherein the tapered bore, such as illustrated in FIG. 7 and described above, is incorporated in chuck device 10. Since the tapered bore has a greater diameter at the forward end of the device, a greater compressive force may be necessary to adequately compress the gripping segments 20 at the forward end.

It is also possible to generate the varying degrees of compressive force for each of the channels by changing the diameter of the rolling balls 38. For example, the axially aligned channels may have the same varying radial width profile, but the actuating elements or balls 38 in the forward channel may have a greater diameter. This arrangement would also generate a greater compressive force in the axially forward channel.

Thus, it should be understood, that the degree of compressive radial force generated in each of the channels can be varied by a combination of factors.

It is also within the scope of the invention that the varying radial width of the channels be defined by ramped sections on the sleeve member 44 or other movable actuating member, and not necessarily defined on the outer circumferential surface of segments 20. In other words, the floor of recesses 28 defined on the outer surface of segments 20 may comprise a uniform flat profile, and the inner circumferential surface of sleeve 44 may comprise ramped surfaces radially opposite from recesses 28. It is also possible that both surfaces define ramped sections. In other words, the opposing surfaces of the actuating member or sleeve 44 and recesses 28 may axially define a conical shaped channel.

Figure 4:
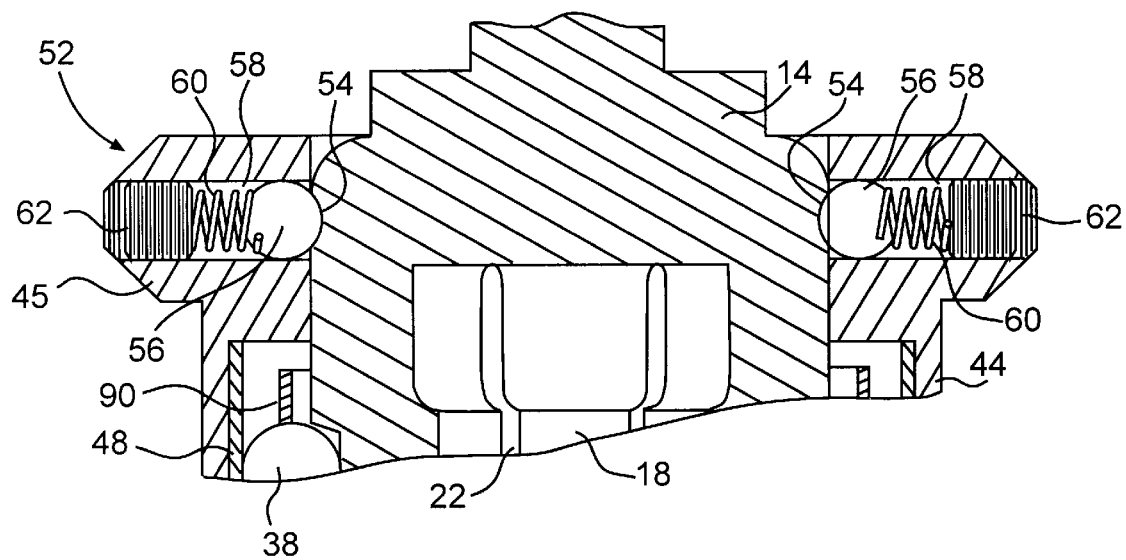
FIG. 4 is an enlarged cross-sectional view of one embodiment of a locking mechanism for the chuck device.

Chuck device 10 according to the invention also includes a locking mechanism, generally 52, to ensure that the device stays in the locked or gripping position as illustrated in FIG. 2. In one embodiment, as illustrated in FIG. 2, the locking mechanism comprises a purely frictional lock between balls 38 and sleeve member 44 or insert 48. The friction between these elements is great enough that the sleeve member will not move unless a significant amount of force is applied to the sleeve member. However, it may also be preferred to incorporate a positive locking mechanism, as illustrated in FIGS. 4 and 6. In the embodiment shown in FIG. 4, the locking mechanism 52 includes a ball and detent device. Balls 56 are housed in openings 58 formed in the flange member 45. In the locking position, balls 56 reside in detents 54 formed in body member 14. The balls are biased radially inward by means of springs 60. Set screws 62 are provided to retain and adjust the springs. In order to move chuck device to its release position, an operator must move sleeve 44 forward with enough force to disengage balls 56 out of detents 54 against the force of springs 60. It should be appreciated that a ball and detent mechanism could be defined directly on the ramped or flat sections of the gripping segments.

FIG. 6 illustrates an alternative embodiment of the chuck device 10. In this embodiment, an intermediate sleeve member 84 is provided between balls 38 and sleeve 44. Intermediate member 84 may also comprise a relatively hard insert member 48. A biasing spring 98 is disposed between a shoulder 85 of intermediate sleeve member 84 and a shoulder 43 of sleeve member 44. An insert 68 is formed with sleeve 44 at the back end thereof. Insert 68 includes a flat section 70, a recessed section 76, and a shoulder 72. A recess 64 defined by a shoulder 66 is defined in body member 14 radially opposite from insert 68. A ball 65 is housed in a hole or opening 67 defined in intermediate sleeve member 84. In the locked position illustrated in FIG. 6, biasing spring 98 forces sleeve 44 axially rearward so that the flat section 70 of insert 68 forces ball 65 radially inward into recess region 64 of body member 14. The ball 65 cannot move axially forward due to shoulder 66.

To move the device from the locked or gripping position shown in FIG. 6 to the release position, an operator grasps the annular flange 47 of sleeve 44 and pulls sleeve 44 axially forward against the force of spring 98. With this axially forward movement, insert 68 moves axially forward until recess 76 is radially opposite of ball 65. At the same time, shoulder 72 of insert 68 contacts shoulder 74 of intermediate sleeve member 84 and further movement of sleeve member 44 in the axially forward direction causes ball 65 to move radially outward into the space defined by recess 76. This action further allows for intermediate sleeve member 84 to be moved axially forward by further movement in the forward direction of sleeve member 44. This forward axial movement of intermediate sleeve member 84 moves rolling bodies 38 into the release position. In order to insert and lock a tool shank into the device, the operator simply pushes sleeve member 44 axially rearward until ball 65 moves into the recesses area 64 of body member 14. When this happens, spring 98 will return the sleeve 44 to the locked position illustrated in FIG. 6.

Figure 9:
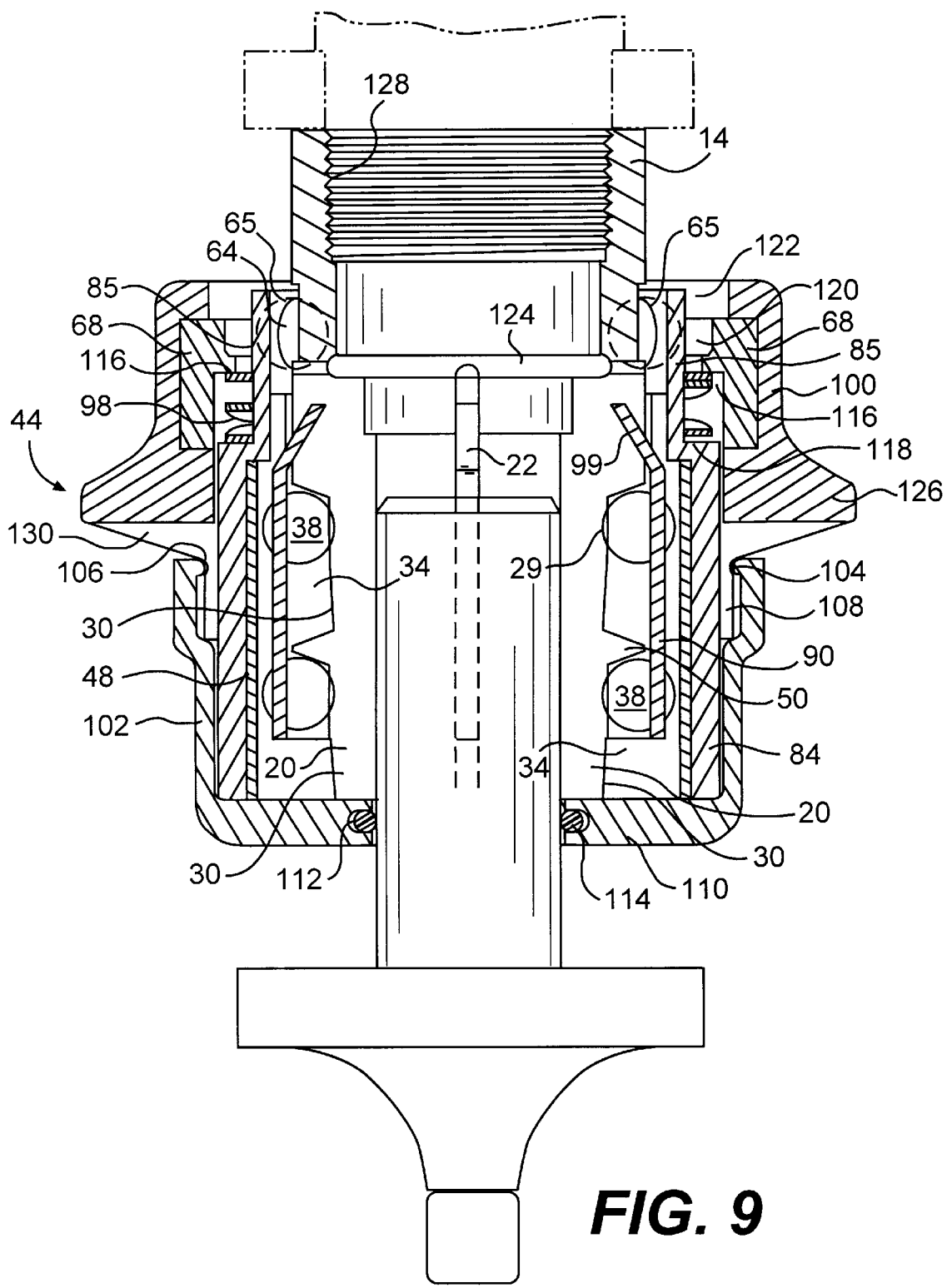
FIG. 9 is a cross-sectional view of an alternate embodiment of the chuck device according to the present invention.
Figure 10:
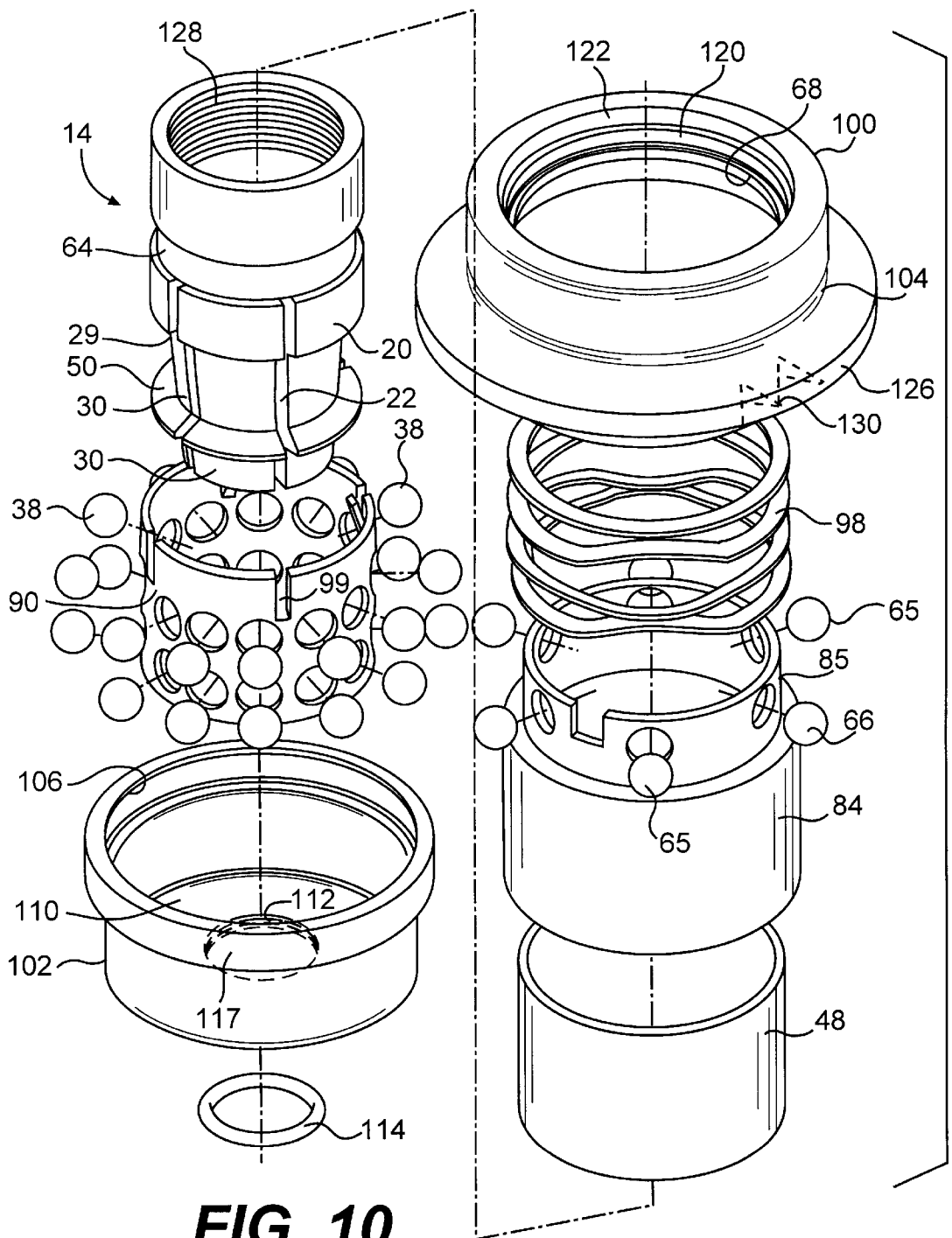
FIG. 10 is an in-line assembly view of the chuck device according to FIG. 9.

An alternative preferred embodiment of the invention similar to that illustrated in FIG. 6 is shown in FIGS. 9 and 10. In this embodiment, body member 14 includes a female threaded bore 128 for threaded attachment onto a male threaded end of the drive spindle, as particularly illustrated in FIG. 9. Body member 14 also includes a circumferential groove 124 essentially defining the axially rearward position of gripping segments 20. Groove 124 ensures that gripping segments 20 flex at the desired location axially rearward of slits 22. In this embodiment, an annular flange member is not necessary at the forward end of the gripping segments 20, as explained in greater detail below. The operation of balls 38 and sleeve 44 is generally the same as that described with regards to FIG. 6 with modifications to the structure of the components. For example, in the embodiment of FIGS. 9 and 10, intermediate sleeve member 84 also forms a ball cage section 85 for the locking mechanism balls 65. In the locked or gripping position of the chuck illustrated in FIG. 9, balls 65 are disposed in holes defined in section 85 of intermediate sleeve 84 and balls 65 are forced radially inward into the recessed region 64 of body member 14. The balls 65 cannot move axially forward or radially outward until the recessed region 122 is brought into radial alignment with balls 65, as described below.

Sleeve 44 in this embodiment comprises an axially rearward sleeve member 100 and an axially forward sleeve member 102. Sleeve 102 is preferably removable from sleeve member 100 and can be attached to sleeve member 100 by any conventional means. In the embodiment illustrated, sleeve member 102 is snap-fitted onto sleeve member 100 by means of a lip 106 that engages in a groove 104 defined on an axially extending portion 108 of sleeve member 100. It should be understood that any conventional attaching means can be utilized in this regard.

Rear sleeve member 100 includes an insert 68 carried therein. Preferably, insert 68 is molded directly into sleeve member 100. Insert 68 defines an annular recess 120 in which balls 65 also reside in the gripping or locked position of the sleeve. Insert 68 also defines a shoulder 116. Shoulder 116 is spaced from a shoulder 118 defined on intermediate member 84. In this embodiment, biasing spring 98 is disposed between shoulders 116 and 118.

To actuate the embodiment of FIGS. 9 and 10, an operator grasps the gripping member 120 defined on rear sleeve member 100 and pulls the sleeve in the axially forward direction. The sleeve is initially pulled against the force of spring 98 until recess 122 formed in the rear section of sleeve member 100 is brought into radial alignment with balls 65. Once this occurs, balls 65 are free to move radially outward and intermediate sleeve member 84 is then free to move axially forward upon further movement of the sleeve member. As the sleeve member moves axially forward, hardened insert member 48 engages against balls 38 and moves balls 38 axially forward into the greater radial width area of channels 34. As balls 38 move against the sloped sections 30 of the gripping segment recesses, the gripping segments 20 are free to move radially outward and thus release upon the tool shank inserted into the chuck device.

Once the tool bit has been changed out and it is desired to move the chuck device to the gripping position, the operator simply grasps gripping member 126 of rear sleeve member 100 and pulls the sleeve member axially rearward. With this motion, balls 38 are forced axially rearward into the narrow width section of channels 34 causing the gripping segments to compress radially inward and grip upon a tool shank inserted into the chuck. As the sleeve is pulled axially rearward, balls 65 will move into recess 64 of body member 14 and the sleeve will become locked in position when recess 120 moves axially beyond balls 65. The chuck will then assume the locked or gripping position as illustrated in FIG. 9.

In the embodiment of FIGS. 9 and 10, the axially forward sleeve section 102 acts as a cap member in that it essentially encloses the front end of the chuck with a forward axial face 110. A bore 117 is defined in face 110 which is in alignment with the body member bore for receiving the tool shank. A tool bit retaining member is incorporated in front sleeve member 102. In the embodiment illustrated, the tool bit retaining member comprises a resilient ring 114 disposed within a groove 112. Resilient ring 114 can comprise any conventional material and preferably has a diameter slightly less than that of bore 117 defined through face 110 of forward sleeve member 102. Ring member 114 has enough resiliency to grip onto the shank of the tool bit inserted into the chuck device and to maintain the tool bit at a desired height or axial position relative to the chuck while the chuck is moved between the release and gripping or locked positions. In this regard, it is not necessary for the operator to manually hold the tool bit in position as the chuck is actuated. The resilient tool retaining member also centers the tool bit within the chuck as the chuck is being actuated.

It should be appreciated that the tool bit retaining member can comprise any resilient type of device incorporated in the forward end of sleeve member 102, and is not limited to the ring member 114 illustrated in the figures. For example, the tool bit retaining member could comprise a spring device, friction fit, etc. Any conventional device or system for applying an initial gripping force to the tool shank to hold the tool bit relative to the chuck body while actuating the chuck is within the scope and spirit of the invention.

Front face 110 of forward sleeve member 102 and ring member 114 also serve as an effective seal for the chuck by inhibiting the migration of dirt, debris, into the internal workings of the chuck. Ring member 114 also serves as a wiper arm or mechanism to clean the tool shank as it is inserted into the bore of the chuck body.

In the event that the chuck does need cleaning or servicing, it is a relatively simple procedure to remove forward sleeve member 102 by inserting a tool into slot 130 defined in gripping member 126 to pry or release lip 106 from groove 104. Forward sleeve member 102 is then easily pulled from rear sleeve member 100 and the internal operating mechanisms of the chuck are then exposed and can be serviced or cleaned as desired.

It should be appreciated that the tool bit retaining member described with regards to FIGS. 9 and 10, including the two-piece sleeve configuration, can be incorporated on any embodiments of the chuck described herein. In this regard, any feature described with respect to one embodiment can be utilized on any other embodiment to yield a number of additional embodiments.

The present invention is suited for any manner of machine tool wherein a tool bit must be rotationally driven. The device is particularly suited for applications such as routers, dry wall cutters, and laminate trimmers wherein relatively great rotational speeds are desired. However, this is in no means a limitation of the invention. In fact, it will be apparent to those skilled in the art that various modifications and variations can be made in the apparatus of the present invention without departing from the scope or spirit of the invention. Thus, it is intended that the present invention cover the modifications and variations as come within the scope of the appended claims and their equivalents.

What is claimed is:

1. A chuck device for receipt of an axially extending tool shank, comprising:

a body member defining a central longitudinal axis and an axially extending bore defined therein for receipt of a tool shank, at least a portion of said bore defined by a plurality of radially compressible axially extending gripping segments separated by equally spaced axial slots extending from a front face of said body member towards a back end thereof;

at least two axially extending and axially aligned recesses defined on each of said segments, each said recess comprising a ramped surface that slopes towards said longitudinal axis;

an operating member coaxial with and surrounding at least said gripping segments of said body member, said operating member cooperating with said recesses to define axially extending channels with varying radial widths, said operating member axially movable relative to said body member;

actuating elements disposed within said channels, said actuating elements axially movable within said channels by axial movement of said operating member from a gripping position wherein said actuating elements are in a reduced radial width section of said channels causing said gripping segments to compress radially inward, and a release position wherein said actuating elements move into a greater radial width section of said channels causing radial expansion of said gripping segments.

2. The chuck device as in claim 1, wherein said operating member comprises a sleeve member having an axially flat inner circumferential surface disposed radially opposite said recesses, said axially flat surface frictionally engaging and moving said actuating elements within said channels upon movement of said sleeve member.

3. The chuck device as in claim 2, further comprising an insert member configured with said sleeve member defining said axially flat surface.

4. The chuck device as in claim 3, wherein said sleeve member is formed of a plastic material.

5. The chuck device as in claim 1, wherein said actuating elements comprise rolling bodies.

6. The chuck device as in claim 1, wherein said recesses are separated by an annular flange member formed on said body member.

7. The chuck device as in claim 1, wherein said channels of each said gripping segment have generally the same varying radial widths.

8. The chuck device as in claim 1, wherein said channels of each said gripping segment have generally different varying radial widths.

9. The chuck device as in claim 8, wherein for each of said segments, said section of reduced radial width for a first said channel closer to said front face has a radial width less than that of said section of reduced radial width for a second said channel axially rearward of said first channel.

10. The chuck device as in claim 1, wherein said actuating elements comprise rolling balls, said rolling balls in each of said channels for each said segment having generally the same diameter.

11. The chuck device as in claim 1, wherein said actuating elements comprise rolling balls, said rolling balls in each of said channels for each said segment having generally different diameters.

12. The chuck device as in claim 11, wherein said rolling balls in a first said channel of each said segment closer to said front face has a greater diameter than that of said rolling balls in a second said channel axially rearward of said first channel.

13. The chuck device as in claim 1, further comprising a locking mechanism configured with said operating member to lock said operating member at least in said gripping position.

14. The chuck device as in claim 13, wherein said locking mechanism comprises a friction lock between said operating member and said actuating elements.

15. The chuck device as in claim 1, wherein said axially aligned recesses for each said segment are aligned with said recesses of adjacent said segments thereby defining circumferential recessed bands on said body member.

16. The chuck device as in claim 1, wherein said bore is tapered from a larger diameter at said front face to a smaller diameter at said back end of said body member.

17. The chuck device as in claim 1, further comprising at least one annular relief defined in said bore.

18. A chuck device for receipt of an axially extending tool shank, comprising:

a body member defining a central longitudinal axis and an axially extending bore defined therein for receipt of a tool shank, at least a portion of said bore defined by a plurality of radially compressible axially extending gripping segments separated by equally spaced axial slots extending from a front face of said body member towards a back end thereof;

at least two axially extending and axially aligned recesses defined on each of said segments;

an operating member coaxial with and surrounding at least said gripping segments of said body member, said operating member cooperating with said recesses to define axially extending and axially aligned channels with varying radial widths, said operating member axially movable relative to said body member;

actuating elements disposed within said channels, said actuating elements axially movable within said channels by axial movement of said operating member from a gripping position wherein said actuating elements are in a reduced radial width section of said channels causing said gripping segments to compress radially inward, and a release position wherein said actuating elements move into a greater radial width section of said channels causing radial expansion of said gripping segments.

19. The chuck device as in claim 18, wherein said varying radial width channels comprise a ramped surface sloped in the longitudinal direction on at least one of said recesses or a surface of said operating member radially opposite from said recesses.

20. The chuck device as in claim 19, wherein said ramped surfaces are defined in said recesses and said operating member comprises a generally flat surface radially opposite from said recesses.

21. The chuck device as in claim 20, wherein said operating member comprises an axially movable sleeve member, said generally flat surface disposed on an inner circumferential surface of said sleeve member.

22. The chuck device as in claim 18, wherein said operating member comprises an axially movable sleeve member having a ramped inner circumferential surface disposed radially opposite said recesses to define said varying radial widths for said channels.

23. The chuck device as in claim 18, wherein said channels of each said gripping segment have generally different varying radial widths.

24. The chuck device as in claim 18, wherein said actuating elements comprises rolling bodies disposed within said channels.

25. The chuck device as in claim 18, further comprising a locking mechanism operably configured with said operating member and said body member to axially lock said operating member in position relative to said body member.

26. The chuck device as in claim 18, wherein said bore is tapered from said front face towards said back end of said body.

27. A chuck device for receipt of an axially extending tool shank, comprising:

a body member defining a central longitudinal axis and an axially extending bore defined therein for receipt of a tool shank, at least a portion of said bore defined by a plurality of radially compressible axially extending gripping segments separated by equally spaced axial slots extending from a front face of said body member towards a back end thereof;

an axially extending recess defined on each of said segments;

an operating member coaxial with and surrounding at least said gripping segments of said body member, said operating member cooperating with said recesses to define axially extending and axially aligned channels with varying radial widths, said operating member axially movable relative to said body member;

actuating elements disposed within said channels, said actuating elements axially movable within said channels by axial movement of said operating member from a gripping position wherein said actuating elements are in a reduced radial width section of said channels, and a release position wherein said actuating elements move into a greater radial width section of said channels; and an actuable outer sleeve member configured with said operating member, said outer sleeve member comprising a front cap section having a bore therethrough generally aligned with said bore in said body member, said cap section further comprising a tool bit retaining member disposed within said bore to engage and retain said tool shank at a desired height upon moving said operating member between said gripping and release positions.

28. The chuck device as in claim 27, wherein said tool bit retaining member comprises a resilient ring member having an inner diameter so as to engage said tool shank while permitting said tool shank to be slid therethrough.

29. The chuck device as in claim 28, wherein said resilient ring member is disposed within a groove defined in said cap section, said groove generally defining said bore in said cap section.

30. The chuck device as in claim 27, wherein said cap section is removable from said outer sleeve member to provide access for servicing said chuck device.

31. The chuck device as in claim 30, wherein said cap section is snap-fitted to said sleeve member.

32. The chuck device as in claim 28, wherein said resilient ring member forms a seal around said tool shank, said cap section and said resilient ring member thereby essentially sealing a forward end of said chuck device to prevent debris from entering said chuck device.

33. The chuck device as in claim 27, wherein said tool bit retaining member maintains said tool shank centered and axially aligned within said body member bore as said operating member is moved between said release and gripping positions.

34. The chuck device as in claim 27, wherein said outer sleeve member comprises an axially extending section with a gripping member defined thereon.

* * * * *